(12) United States Patent
Xin et al.

(10) Patent No.: US 11,522,152 B2
(45) Date of Patent: Dec. 6, 2022

(54) DISPLAY PANEL AND FABRICATION METHOD THEREOF, AND DISPLAY APPARATUS

(71) Applicants: Wuhan Tianma Micro-Electronics Co., Ltd., Wuhan (CN); Wuhan Tianma Microelectronics Co., Ltd. Shanghai Branch, Shanghai (CN)

(72) Inventors: Yu Xin, Shanghai (CN); Lijing Han, Shanghai (CN); Xian Chen, Shanghai (CN)

(73) Assignees: Wuhan Tianma Micro-Electronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 0 days.

(21) Appl. No.: 16/727,552

(22) Filed: Dec. 26, 2019

(65) Prior Publication Data

US 2021/0135149 A1 May 6, 2021

(30) Foreign Application Priority Data

Oct. 31, 2019 (CN) .......................... 201911055925.5

(51) Int. Cl.
*H01L 27/32* (2006.01)
*H01L 51/52* (2006.01)
(Continued)

(52) U.S. Cl.
CPC ...... *H01L 51/5228* (2013.01); *H01L 27/3216* (2013.01); *H01L 27/3279* (2013.01);
(Continued)

(58) Field of Classification Search
CPC ... H01L 27/3216–3218; H01L 27/3279; H01L 51/5228
See application file for complete search history.

(56) References Cited

U.S. PATENT DOCUMENTS

| 9,048,454 B2 | 6/2015 | Song et al. |
| 10,177,207 B2 | 1/2019 | Park et al. |
| (Continued) | | |

FOREIGN PATENT DOCUMENTS

| CN | 105590954 A | 5/2016 |
| CN | 107808897 A | 3/2018 |
| (Continued) | | |

*Primary Examiner* — Eric K Ashbahian
(74) *Attorney, Agent, or Firm* — Anova Law Group, PLLC (57) ABSTRACT

A display panel, a method for fabricating a display panel and a display apparatus are provided. The display panel includes a substrate; a plurality of discrete first electrodes, a pixel define layer, a metal connection layer disposed on a side of the pixel define layer facing away from the substrate, wherein an orthographic projection of the metal connection layer on the substrate at least surrounds half of each opening of the plurality of openings; an organic light-emitting layer, and at least one second electrode, disposed on a side of the organic light-emitting layer and the pixel define layer facing away from the substrate. An orthographic projection of the at least one second electrode on the substrate covers an orthographic projection of the pixel define layer and the plurality of first electrodes on the substrate and the at least one second electrode is electrically connected to the metal connection layer.

13 Claims, 8 Drawing Sheets

(51) Int. Cl.
*H01L 51/56* (2006.01)
*H01L 51/00* (2006.01)

(52) U.S. Cl.
CPC .......... *H01L 51/56* (2013.01); *H01L 51/0011* (2013.01); *H01L 51/5265* (2013.01)

(56) References Cited

U.S. PATENT DOCUMENTS

| | | | |
|---|---|---|---|
| 2014/0252321 A1* | 9/2014 | Pyon | H01L 27/3246 257/40 |
| 2014/0319486 A1* | 10/2014 | Hong | G09G 3/32 257/40 |
| 2015/0162391 A1* | 6/2015 | Kim | H01L 51/525 257/40 |
| 2015/0200237 A1* | 7/2015 | Yim | H01L 51/525 257/40 |
| 2017/0194396 A1* | 7/2017 | Choe | H01L 51/5088 |
| 2019/0006427 A1* | 1/2019 | Lu | H01L 27/3276 |
| 2019/0140030 A1* | 5/2019 | Huangfu | H01L 27/3279 |
| 2020/0119114 A1* | 4/2020 | Kim | H01L 51/5225 |
| 2020/0209177 A1* | 7/2020 | Kim | G09G 3/3258 |
| 2020/0235172 A1* | 7/2020 | Lee | H01L 27/323 |
| 2020/0343315 A1* | 10/2020 | Lin | H01L 51/5228 |
| 2020/0357862 A1* | 11/2020 | Wang | H01L 27/3218 |
| 2020/0403180 A1* | 12/2020 | Seon | H01L 51/5253 |
| 2021/0036066 A1* | 2/2021 | Luo | H01L 27/3218 |

FOREIGN PATENT DOCUMENTS

| | | |
|---|---|---|
| CN | 109103215 A | 12/2018 |
| CN | 109713162 A | 5/2019 |

\* cited by examiner

DISPLAY PANEL AND FABRICATION METHOD THEREOF, AND DISPLAY APPARATUS

CROSS-REFERENCES TO RELATED APPLICATIONS

This application claims priority of Chinese Patent Application No. 201911055925.5, filed on Oct. 31, 2019, the entire contents of which are hereby incorporated by reference.

FIELD OF THE DISCLOSURE

The present disclosure generally relates to the field of display technology and, more particularly, relates to a display panel and a method for fabricating a display panel, and a display apparatus.

BACKGROUND

Organic light-emitting diode (OLED) devices have the advantages of self-emitting, fast response, wide viewing angle, high brightness, vivid color, and small thickness, etc.; and they are considered as the next generation display devices. OLED devices have two emission methods: bottom emission and top emission. Comparing with the bottom-emission OLED devices, the top-emission OLED devices have higher resolution and color saturation, and have high emission efficiency, wide color gamut, and long life.

In a top-emission OLED device, the cathode should have a high transmittance and conductivity. To ensure the high transmittance of the cathode, it is necessary to make the thickness of the cathode to be small. However, the smaller the thickness of the cathode is, the larger the resistance value of the cathode is. Accordingly, the voltage drop in the display area is substantially large. As a result, the voltage distribution in the display area is uneven. Further, the difference between the voltage on the display area and the voltage on the peripheral fixed voltage signal line (PVEE) is relatively large. Thus, the display uniformity of the OLED device may be unacceptable.

The disclosed display panel and method for fabricating the display panel, and display apparatus are directed to solve one or more problems set forth above and other problems in the art.

BRIEF SUMMARY OF THE DISCLOSURE

One aspect of the present disclosure provides a display panel. The display panel may include a substrate; a plurality of first electrodes disposed on a side of the substrate and discrete from each other; a pixel define layer disposed on a same side of the substrate with the plurality of first electrodes and including a plurality of openings exposing each of the plurality of first electrodes, respectively; and a metal connection layer disposed on a side of the pixel define layer facing away from the substrate. An orthographic projection of a pattern of the metal connection layer on the substrate at least surrounds substantially half of at least one opening of the plurality of openings. The display panel may also include an organic light-emitting layer, disposed on the side of the pixel define layer facing away from the substrate; and at least one second electrode, disposed on a side of the organic light-emitting layer and the pixel define layer facing away from the substrate. An orthographic projection of the at least one second electrode on the substrate covers an orthographic projection of the pixel define layer; and the plurality of first electrodes on the substrate and the at least one second electrode is electrically connected to the metal connection layer.

Another aspect of the present disclosure provides a method for forming a display panel. The method may include forming a plurality of discrete first electrodes on a surface of a substrate; forming a pattern of a pixel define layer on a side of the plurality of first electrodes facing away from the substrate; forming a pattern of a metal connection layer on a side of the pixel define layer facing away from the substrate; forming an organic light-emitting layer on a side of the metal connection layer facing away from the substrate; and forming at least one second electrode electrically connected to the metal connection layer on a side of the organic light-emitting layer facing away from the substrate.

Another aspect of the present disclosure provides a display apparatus. The display apparatus includes a display panel. The display panel may include a substrate; a plurality of first electrodes disposed on a side of the substrate and discrete from each other; a pixel define layer disposed on a same side of the substrate with the plurality of first electrodes and including a plurality of openings exposing each of the plurality of first electrodes, respectively; and a metal connection layer disposed on a side of the pixel define layer facing away from the substrate. An orthographic projection of a pattern of the metal connection layer on the substrate at least surrounds substantially half of at least one opening of the plurality of openings. The display panel may also include an organic light-emitting layer, disposed on the side of the pixel define layer facing away from the substrate; and at least one second electrode, disposed on a side of the organic light-emitting layer and the pixel define layer facing away from the substrate. An orthographic projection of the at least one second electrode on the substrate covers an orthographic projection of the pixel define layer; and the plurality of first electrodes on the substrate and the at least one second electrode is electrically connected to the metal connection layer Other aspects of the present disclosure can be understood by those skilled in the art in light of the description, the claims, and the drawings of the present disclosure.

BRIEF DESCRIPTION OF THE DRAWINGS

The following drawings are incorporated in and constitute a part of the specification, illustrating embodiments of the present disclosure, and together with the detailed descriptions serve to explain the mechanism of the present disclosure.

DETAILED DESCRIPTION

Reference will now be made in detail to exemplary embodiments of the disclosure, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all the embodiments of the present disclosure. Based on the disclosed embodiments, persons of ordinary skill in the art may derive other embodiments consistent with the present disclosure, all of which are within the scope of the present disclosure. Further, in the present disclosure, the disclosed embodiments and the features of the disclosed embodiments may be combined when there are no conflicts.

Certain techniques, methods, and apparatus that are understandable to the persons of ordinary skill in the art may not be described in detail. However, under appropriate conditions, such techniques, methods and apparatus are also included as the parts of the description.

In the disclosed embodiments, specific values may be explained for illustrative purposes and might not be used as limitations. Thus, embodiments may have different specific values.

Further, the similar symbols and letters in the drawings may denote similar elements. Thus, once one element is defined in one drawing, it may not need to be defined in the following drawings.

Figure 1:
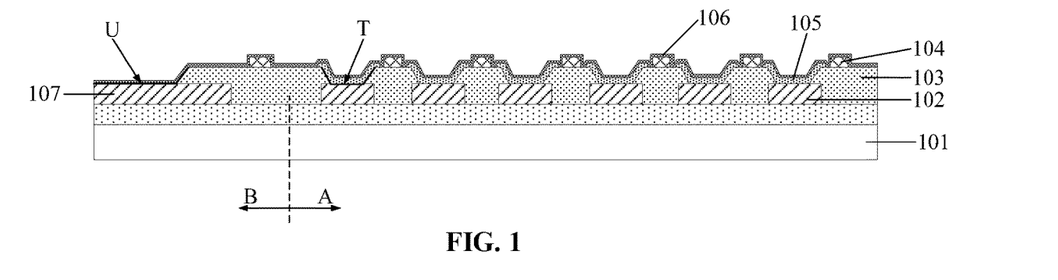
FIG. 1 illustrates a cross-sectional view of an exemplary display panel consistent with various disclosed embodiments of the present disclosure.

The present disclosure provides a display panel and a method for forming a display panel, and a display apparatus. FIG. 1 illustrates a top view of an exemplary display panel consistent with various disclosed embodiments of the present disclosure.

As shown in FIG. 1, the display panel may include a substrate 101; and a plurality of first electrodes 102 disposed on the base substrate 101. Each of the plurality of first electrodes 101 may be separated from each other.

Further, the display panel may include a pixel define layer 103 disposed on a same side of the substrate 101 as the first electrodes 102. The pixel define layer 103 may include a plurality of openings T respectively exposing each of the first electrodes 102.

Further, the display panel may include a metal connection layer 104 disposed on a side of the pixel define layer 103 facing away from the substrate 101. The orthographic projection of the pattern of the metal connection layer 104 on the substrate 101 may at least surround half of the opening T (i.e., half-surround the opening T).

Further, the display panel may include an organic light-emitting layer 105 disposed on a side of the pixel define layer 103 facing away from the substrate 101.

Further, the display panel may include at least one second electrode 106 disposed on the side of the organic light-emitting layer 105 and the pixel define layer 103 facing away from the substrate 101. The orthographic projection of the second electrode 106 on the substrate 101 may cover the orthographic projection of the pixel define layer 103 and the first electrodes 102 on the substrate 101. The at least one second electrode 106 may be electrically connected to the metal connection layer 104.

In the display panel provided by the present disclosure, a metal connection layer may be disposed on a side of the pixel define layer facing away from the substrate, and the metal connection layer may be electrically connected to the at least one second electrode. Because the metal connection layer may be electrically connected with the at least one second electrode in parallel, the in-plane resistance of the second electrode may be reduced; and the voltage drop in the display area may be reduced. Accordingly, the voltage distribution in the display area may be more uniform, and the difference between the voltage on the display area and the voltage on the peripheral fixed voltage signal line may be substantially small. Thus, the display uniformity of the display panel may be improved. Because the in-plane resistance of the second electrode may be reduced by connecting with the metal connection layer, the second electrode may be formed to be substantially thin to ensure that the second electrode may have a substantially high light transmittance. Further, the orthographic projection of the patterns of the metal connection layer on the substrate may at least partially surround the openings. Thus, the spaces in the non-opening area may be fully utilized to ensure that the area of the pattern of the metal connection layer is substantially large; and the resistance of the metal connection layer may be further reduced. Accordingly, the resistance after connecting the metal layer with the second electrode in parallel may be further reduced; and the display uniformity of the display panel may be further improved.

In one embodiment of the present disclosure, the first electrodes 102 may be anodes, and the second electrode 106 may be cathode. In some embodiments, the first electrodes 102 may be cathodes, and the second electrode 106 may be anodes. For illustrative purposes, the first electrodes 102 are used as the anodes, and the second electrodes 106 may be used as the cathode.

In one implementation, a driving circuit may be further included between the first electrodes 102 and the substrate 101. The driving circuit may be electrically connected to each of the first electrodes 102 to provide a driving signal to each of the first electrodes 102 to realize the screen display.

In practical applications, the pixel define layer 103 and the first electrodes 102 may be disposed on the same side of the substrate 101. The first electrodes 102 may be disposed on the side of the pixel define layer 103 adjacent to the substrate 101. Each of the first electrodes 102 may be exposed by one opening T in the pixel define layer 103 such that the organic light-emitting layer 105 may be in contact with the first electrodes 102. Accordingly, the first electrodes 102 may provide carriers to the organic light-emitting layer 105.

In one implementation, the at least one second electrode 106 may be formed as an entire layer. The second electrode 106 may be disposed on the side of the pixel define layer 103, the metal connection layer 104 and the organic light-emitting layer 105 facing away from the substrate 101. During the manufacturing process, the second electrode 106 may be formed on the side of the connection metal layer 104 facing away from the substrate 101 by an evaporation process such that the metal connection layer 104 may be in direct contact with the second electrode 106 to achieve an electrical connection. By electrically connecting the metal connection layer 104 with the second electrode 106 in parallel, the in-plane resistance of the second electrode 106 may be reduced, and the voltage distribution in the display area may be more uniform. Accordingly, the display uniformity of the display panel may be improved. To obtain a desired electrical conductivity between the metal connection layer 104 and the second electrode 106, the connection metal layer 104 may be made of a metal or an alloy with a desired conductivity.

In one embodiment of the present disclosure, the metal connection layer 104 may be disposed on a side of the pixel define layer 103 facing away from the substrate 101. Thus, the distance between the metal connection layer 104 and the second electrode 106 may be reduced, and the breakage of the second electrode 106 caused by the height difference of the metal connection layer 104 may be avoided. Further, the side of the pixel define layer 103 facing away from the substrate 101 generally may not have other metal film layers. Thus, the space for forming the pattern of the metal connection layer may be substantially large, and it may be easier to form the pattern of the metal connection layer with a larger area. Accordingly, it may facilitate to reduce the voltage drop.

Figure 2:
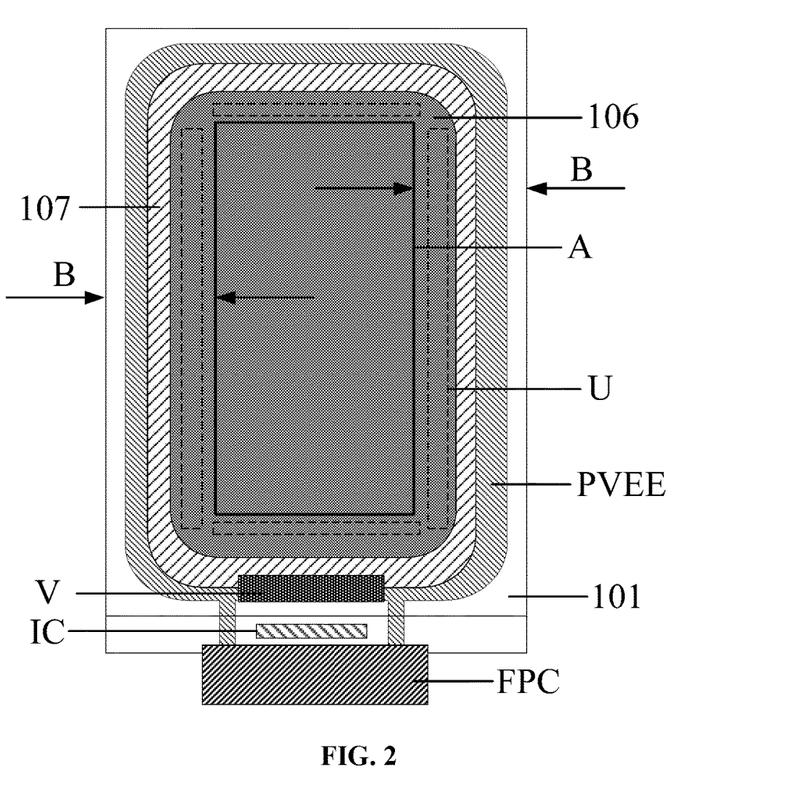
FIG. 2 illustrates a top view of an exemplary display panel consistent with various disclosed embodiments of the present disclosure.

FIG. 2 illustrates a top view of an exemplary display panel consistent with various disclosed embodiments of the present disclosure. As shown in FIG. 1 and FIG. 2, the display panel may include a display area A and a non-display area B surrounding the display area A. The area other than the display area A in the display panel may be the non-display area B.

The non-display area B may include a conductive structure 107 disposed on the same layer as the first electrodes 102, and a fixed potential signal line PVEE disposed between the film layer where the first electrodes 102 are located and the substrate 101.

The orthographic projection of the conductive structure 107 on the substrate 101 and the orthographic projection of the second electrode 106 on the substrate 101 may have a certain overlap area. The second electrode 106 and the conductive structure 107 may be in contact with each other in the overlapped area.

The fixed potential signal line PVEE may surround the display area A, and the conductive structure 107 may be electrically connected to the fixed potential signal line PVEE.

The conductive structure 107 and the first electrodes 102 may be disposed on the same layer. In a practical fabrication process, the conductive structure 107 and the first electrodes 102 may be formed by a same patterning process. Thus, the patterning process may be saved; and the production cost may be reduced.

Further, as shown in FIG. 2, the display panel may further include a display chip IC. The display chip IC may drive the display panel to perform the screen display. In practical applications, a flexible circuit board FPC may provide the voltage required for displaying to the second electrode 106 through the fixed potential signal line PVEE. Because the fixed potential signal line PVEE may be disposed between the first electrodes 102 and the substrate 101, and the second electrode 106 may be disposed on the side of the first electrodes 102 facing away from the substrate 101, the fixed potential signal line PVEE and the second electrode 106 may not be directly in electrical contact with each other, but need to be indirectly electrically connected with each other through the conductive structure 107.

In particular, the conductive structure 107 may be disposed in the peripheric region of the display area A, and the conductive structure 107 may half-surround the display area A, or the conductive structure 107 may surround the display area A. The specific position of the conductive structure is not limited in the present disclosure. The orthographic projection of the conductive structure 107 on the substrate 101 and the orthographic projection of the second electrode 106 on the substrate 101 may have a certain overlapped area. As shown in FIG. 1, the pixel define layer 103 may have a through-hole U in the overlapping area. The through-hole U may pass through the pixel define layer 103 such that the conductive structure 107 and the second electrode 106 may be electrically connected with each other. To illustrate the position of the through-hole U, the position of the through hole U is shown by a dashed box in FIG. 2. Further, the conductive structure 107 may be electrically connected to the fixed potential signal line PVEE through the via V in the non-display area B. The conductive structure 107 may also be electrically connected to the fixed potential signal line PVEE at the left and right borders in the non-display area B to achieve an electrical connection between the fixed potential signal line PVEE and the second electrode 106.

Further, the orthographic projection of the conductive structure 107 on the substrate 101 may surround the display area A, and the fixed potential signal line PVEE may surround the display area A. Thus, the second electrode 106 may be provided with a voltage required for displaying from multiple orientations to reduce the difference of the voltages at different positions. Accordingly, the uniformity of the voltages in the display area may be improved.

In a specific implementation, as shown in FIG., in display panel provided by the present disclosure, the orthographic projection of the pattern of the metal connection layer 104 on the substrate 101 may be located within the orthographic projection of the pixel define layer 103 on the substrate 101.

In particular, the pattern of the metal connection layer 104 may be disposed on the pattern of the pixel define layer 103. In another word, the metal connection layer 104 may be disposed in the non-opening area of the display area. Thus, the effect of the metal connection layer 104 to the aperture ratio of the display panel may be prevented; and the disposition of the metal connection layer 104 may not affect the normal display of the display panel.

In practical applications, the display panel provided by the present disclosure may further include photo spacers disposed on a side of the pixel define layer facing away from the substrate. The orthographic projection of the photo spacers on the substrate may be located within the orthographic projection of the pixel define layer on the substrate. Further, the orthographic projection of the photo spacers on the substrate may not overlap with the orthographic projection of the pattern of the metal connection layer on the substrate.

In particular, the photo spacers may also be disposed on the pattern of the pixel define layer. In another word, the photo spacers may also be disposed in the non-opening area of the display area such that the photo spacers may be prevented from affecting the aperture ratio of the display panel, and the disposition of the photo spacer may not affect the normal display of the display panel. To play a desired supporting function, the display panel may generally be provided with multiple photo spacers. The multiple photo spacers may be distributed as evenly as possible in the display panel. To avoid affecting the supporting function of the photo spacers, or to prevent the overlapping of the metal connection layer and the photo spacers to affect the display effect of the display panel, the pattern of the metal connection layer may be disposed on regions of the pattern of the pixel define layer except regions having the photo spacers.

In one embodiment of the present disclosure, the orthographic projection of the pattern of the metal connection layer on the substrate may at least half-surround the openings so as to make full use of the space in the non-opening area. Such a configuration may ensure the pattern of the metal connection layer to have a larger area to further reduce the resistance of the metal connection layer. Thus, the display uniformity of the display panel may be improved.

In practical applications, the pattern of the metal connection layer may have multiple implementations. For illustrative purposes, a diamond-type pixel arrangement and a 7C-type pixel arrangement are used as examples to illustrate the implementation manners of the metal connection layer.

Figure 3:
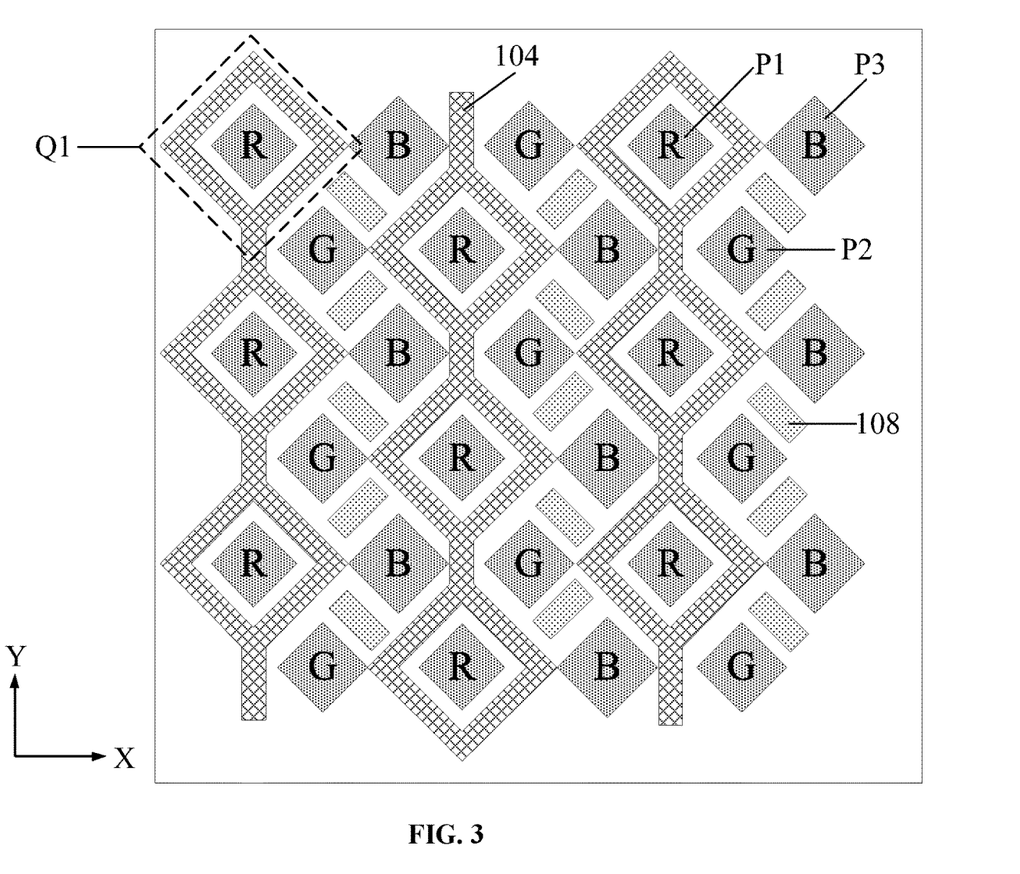
FIG. 3 illustrates an exemplary metal connection layer of a display panel consistent with various disclosed embodiments of the present disclosure.

FIG. 3 illustrates an exemplary pattern of the metal connection layer of a display panel consistent with various embodiments of the present disclosure. As shown in FIG. 3, in the display panel provided by the present disclosure, the pattern of the metal connection layer 104 may include a plurality of ring structures (such as Q1 in FIG. 3), and each ring structure may surround at least one opening.

Setting the pattern of the metal connection layer as the plurality of ring structures may make full use of the space at the edges of the openings and make the areas of the pattern of the metal connection layer as large as possible. In particular, each ring structure may surround one opening. In some embodiments, each ring structure may surround two, three or more openings. The configuration that each ring structure of the pattern of the metal connection layer surrounds one opening will be used as an example for the description. The cases where each ring structure surrounds more openings may be with reference to the case where the ring structure surrounds one opening.

Figure 4:
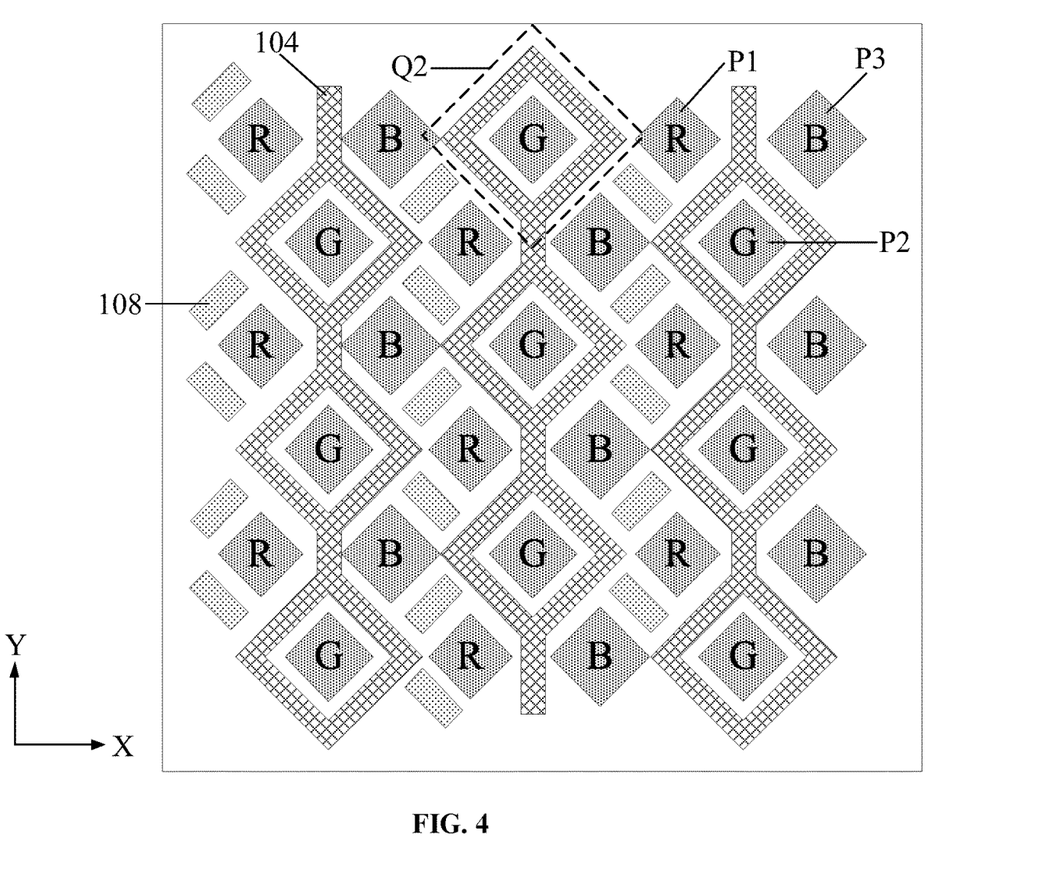
FIG. 4 illustrates another exemplary metal connection layer of a display panel consistent with various disclosed embodiments of the present disclosure.

In particular, in one embodiment of the present disclosure, the display panel may use a diamond-type pixel arrangement. As shown in FIG. 3 and FIG. 4, the display panel may include a plurality of pixel units. The plurality of pixel units may include pixel units of different colors, such as first pixel units P1, second pixel units P2, and third pixel units P3.

The plurality of openings in the pixel define layer may be divided into first openings, second opening, and third openings corresponding to the first pixel units P1, the second pixel units P2, and the third pixel units P3, respectively.

The plurality of pixel units may be arranged as an array along the first direction X and the second direction Y. The first direction X and the second direction Y may intersect with each other. In one embodiment, the first direction X and the second direction Y may be perpendicular to each other. In some embodiments, the first direction X and the second direction Y may have an acute angle.

The first pixel unit P1, the second pixel unit P2, and the third pixel unit P3 may be cyclically arranged with a fixed order along the first direction X. For example, as shown in FIG. 3, each pixel in each pixel unit row extending along the first direction X are cyclically arranged in the order of P1, P3, and P2.

Two adjacent pixel unit rows extending along the first direction X may be arranged with dislocations. For example, as shown in FIG. 3, the second pixel unit row extending along the first direction X may be retracted inwardly with a certain distance. Each pixel unit in the same pixel unit row extending along the second direction Y may have a same color. For example, as shown in FIG. 3, each pixel unit in the first pixel unit row extending along the second direction Y may be the first pixel unit P1.

In particular, as shown in FIG. 3, in one embodiment of the present disclosure, the first pixel unit P1 may be a red (R) color pixel unit, and the second pixel unit P2 may be a green (G) color pixel unit, and the third pixel unit P3 may be a blue (B) color pixel unit. The sizes of the first pixel unit P1 and the second pixel unit P2 may be smaller than that of the third pixel unit P3.

In practical applications, comparing with red and green pixel units, the wavelength of blue pixel units may be generally shorter. To prevent the blue pixel units from decreasing brightness due to attenuation, which affects the display effect of the display panel, the size of the blue pixel units may be increased to compensate the display brightness of the blue pixel units to ensure the display effect of the display panel. Further, in some specific implementations, the size of the red pixel units may be set smaller than that of the green pixel units.

Further, as shown in FIG. 3, the ring structure Q1 may surround the first opening (i.e., the opening corresponds to the first pixel unit P1). The ring structures Q1 arranged along the second direction Y may be connected to each other.

The photo spacers 108 may be disposed between the second opening and the third opening. In particular, the photo spacer 108 may be disposed between the opening corresponding to the second pixel unit P2 and the opening corresponding to the third pixel unit P3.

Because the size of the red pixel unit may be relatively small, the space around the corresponding first opening may be relatively large. Setting the ring structure to surround the first opening may fully utilize the space around the first opening to make the area of the ring structure to be relatively large. Further, the ring structures arranged along the second direction Y may be connected to each other. Thus, the area of the metal connection layer may be further increased.

Among the organic light-emitting layer in the pixel units, many organic film layers for transporting carriers may be common film layers, such as hole transport layers, etc. When a certain pixel unit emits light, for example, when a red pixel unit emits light, the carriers in the common film layer may migrate laterally to other pixel units, for example, laterally migrate to green pixel units or blue pixel units. The carriers may pass through the light-emitting layer to reach the cathode, and then a light leakage may occur. In one embodiment of the present disclosure, by arranging the ring structure around the first opening, the laterally migrated carriers may tend to flow toward the metal connection layer. Thus, the light leakage may be avoided.

Further, because the wavelength of the light emitted by the red pixel unit may be longer, the microcavity of the red pixel unit may be longer. Thus, the position of the light emitting center may be closer to the upper surface of the pixel define layer. Thus, the blocking effect of the metal connection layer to the light may be weaken.

Setting the photo spacer between the second opening and the third opening may keep away from the space occupied by the pattern of the metal connection layer, and the overlap between the pattern of the photo spacer and the metal connection layer may be avoided. In the practical process, the photo spacer may be formed after forming the metal connection layer, then the second electrode may be formed by an evaporation process. If the photo spacer and the pattern of the metal connection layer overlaps, the metal connection layer covered by the photo spacer may not contact the second electrode. Thus, the connection between the metal connection layer and the second electrodes may be affected.

During the evaporation process, the photo spacer 108 may support the mask plate, and there is a gap between the mask plate and the display panel. The vapor-deposited material may pass through the area outside the gap metal opening, and the photo spacer 108 may block the evaporation path of the light-emitting material. Further, the turn-on voltage of the blue pixel unit P3 may be relatively small. During the display process with a higher brightness, due to the lateral migration of carriers, materials outside the opening area may also have a light-leakage, the pixel unit may be deformed, and the brightness may also change. As shown in FIG. 4, the blue pixel units P3 may all correspond to the long sides of the photo spacers 108. Such a configuration may alleviate the light leaking phenomenon in the area around the blue pixels.

In one embodiment, the distance between adjacent pixel units may be generally greater than or equal to 30 and the line width of the pattern of the metal connection layer should be smaller than the distance between adjacent pixel units. For example, the line width of the metal connection layer may be equal to or greater than 10 μm and smaller than or equal to 25 μm.

In addition, the ring structure may be set to surround the third opening, and the ring structure may also be set to surround two, three, or more consecutive openings. When allowed, all ring structures in the metal connection layer may be connected to each other to form a mesh structure so as to further increase the area of the pattern of the metal connection layer.

Figure 5:
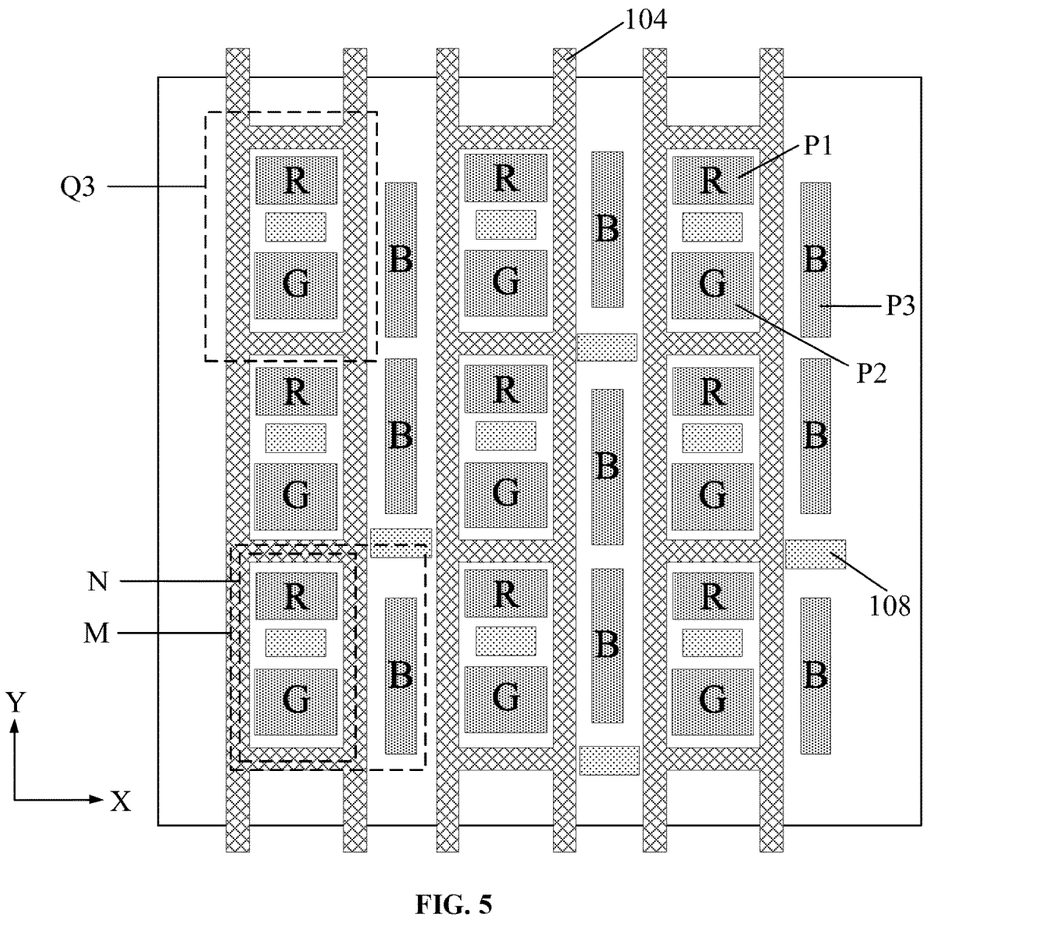
FIG. 5 illustrates another exemplary metal connection layer of a display panel consistent with various disclosed embodiments of the present disclosure.

In another embodiment, as shown in FIG. 5, in the display panel provided by the present disclosure, the pixels may be arranged in a it-type pattern. The display panel may include a plurality of pixel units. The plurality of pixel units may include a plurality of repeating units M arranged as an array along the first direction X and the second direction Y. The first direction X and the second direction Y may intersect with each other.

The repeating units M may include first pixel units P1, second pixel units P2, and third pixel unit P3 of three different colors. The plurality of openings in the pixel define layer may include first openings, second openings, and third openings corresponding to the first pixel units P1, the second pixel units P2, and the third pixel units P3, respectively.

One first pixel unit P1 and one second pixel unit P2 in one repeating unit M may form one pixel unit group N. The first pixel unit P1 and the second pixel unit P2 in the pixel unit group N may be arranged along the second direction Y. The third pixel unit P3 in the repeating unit M may be located at one side of the pixel unit group N along the first direction X. For illustrative purposes, the configuration that the third pixel unit P3 is located at the right side of the pixel unit group N is illustrated in FIG. 5. In some embodiments, the third pixel unit P3 may be located at the left side of the pixel unit group N.

In particular, referring to FIG. 5, in the display panel provided by the present disclosure, the ring structure Q3 may surround the first opening corresponding to the pixel unit group (i.e., the opening corresponds to the first pixel unit P1) and the second opening (i.e., the opening corresponds to the second pixel unit), and each ring structure arranged along the second direction Y may be connected to each other.

Further, the photo spacer 108 may be disposed between the first opening and the second opening corresponding to the pixel unit group N. In some embodiments, the photo spacer 108 may be located between two adjacent third openings along the second direction Y.

Disposing the ring structure Q3 to surround the first opening and the second opening may fully utilize the spaces around the first opening and the second opening. Thus, the area of the ring structure Q3 may be relatively large. Further, each ring structure Q3 arranged along the second direction Y may be connected to each other. Thus, the area of the metal connection layer may be further increased. Furthermore, by setting the ring structure Q3 to surround the first opening and the second opening, the carriers that migrate laterally may tend to flow toward the metal connection layer. Thus, the light leaking phenomenon may be avoided.

Further, the wavelengths of the emitted light of the red pixel unit and the green pixel unit may be longer than the wavelength of the emitted light of the blue pixel, and the microcavity lengths of the red pixel unit and the green pixel unit may be longer than the microcavity length of the blue pixel. Thus, the position of the light emission center may be more close to the pixel define layer. Accordingly, the blocking effect of the metal connection layer to the light may be reduced.

In the practical fabrication process, the photo spacers may be formed after forming the metal connection layer; and then the second electrode may be formed by an evaporation process. If the photo spacers and the pattern of the metal connection layer overlaps, the metal connection layer covered by the photo spacers may be unable to contact the second electrodes. Thus, the contact effect between the metal connection layer and the second electrodes may be affected. Therefore, disposing the photo spacers 108 between the first opening and the second opening in the pixel unit group N may prevent the contact effect between the metal connection layer and the second electrodes from being affected by the condition that the photo spacers cover the pattern of the metal connection layer. Further, the space between the pixel units may be reasonably used.

Further, in practical applications, the ring structure may also be disposed to surround the third opening. In some embodiments, the ring structure may also surround only one opening or three or more openings.

In another embodiment of the present disclosure, the pattern of the metal connection layer may include a plurality of strip-shaped structures, and the strip-shaped structures may include at least one half-surrounding structure. The half-surrounding structure may partially surround an opening. In one example, the half-surrounding structure may surround substantially half of an opening, although the half-surrounding structure may surround any suitable portion, less than or more than half, of the opening. Using such a configuration, the pattern of the metal connection layer may be more flexible in the spaces among the pixel units. Thus, the spaces among the pixel units may be more fully utilized, and the area of the pattern of the metal connection layers may be made as large as possible.

In the following, the display panel having a diamond-type pixel arrangement will be used as an example to describe the pattern of the metal connection layer in detail.

Figure 6:
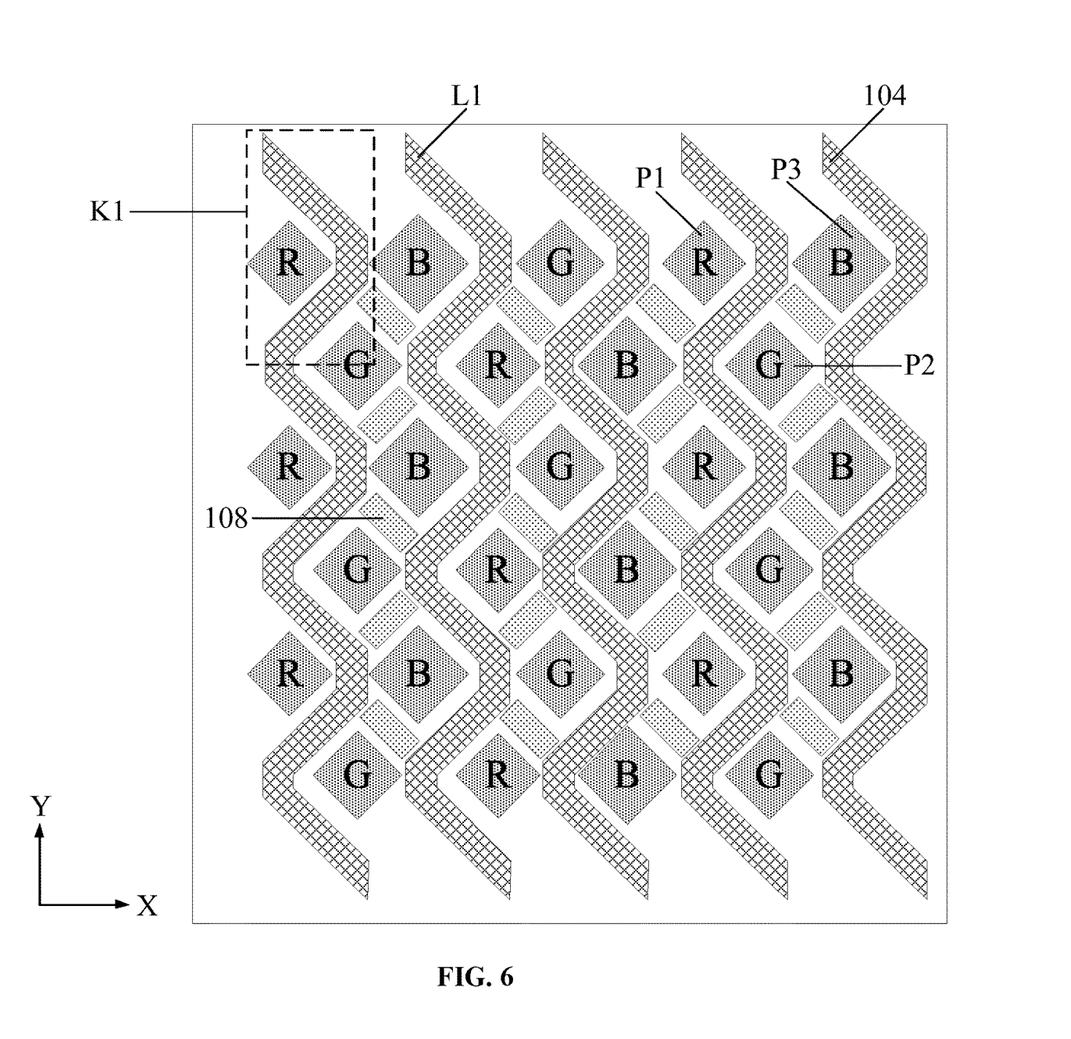
FIG. 6 illustrates another exemplary metal connection layer of a display panel consistent with various disclosed embodiments of the present disclosure.
Figure 7:
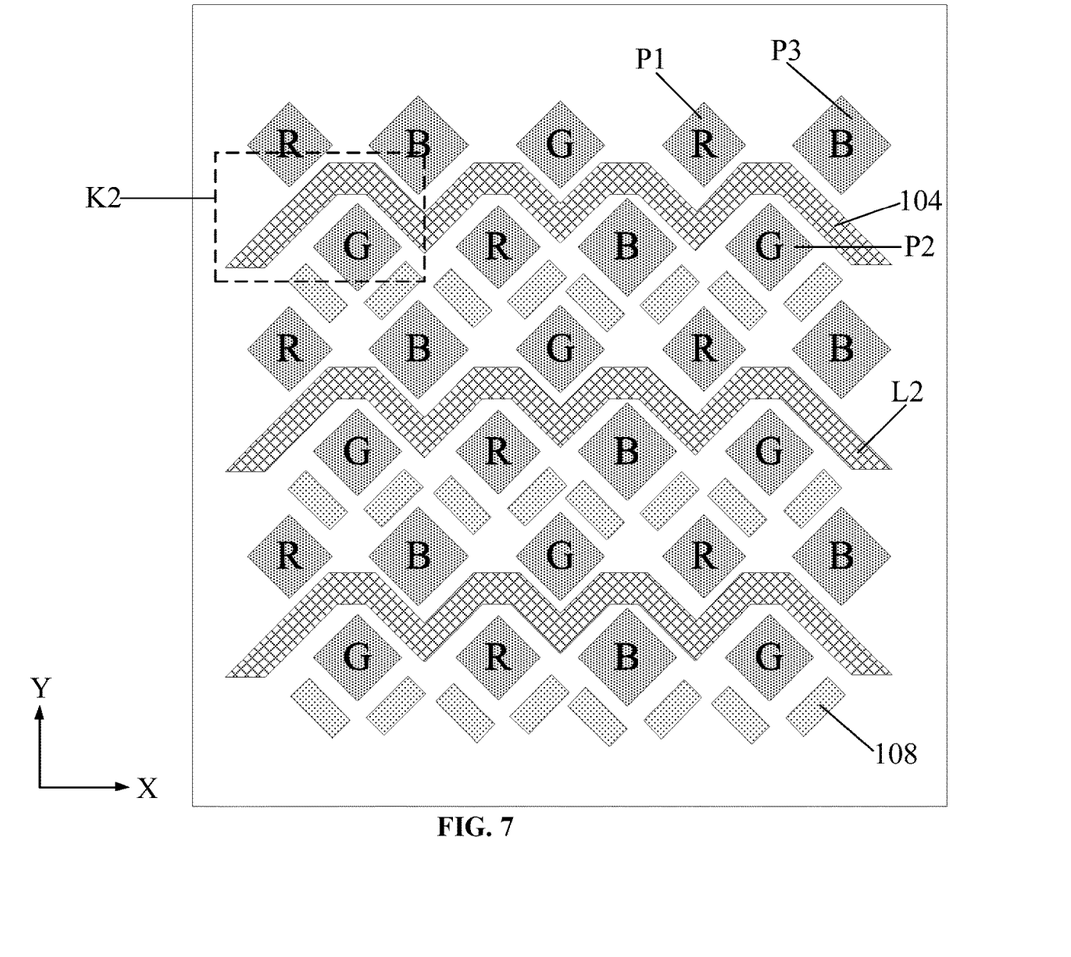
FIG. 7 illustrates another exemplary metal connection layer of a display panel consistent with various disclosed embodiments of the present disclosure.

As shown in FIGS. 6-7, the display panel may include a plurality of pixel units. The plurality of pixel units may include first pixel units P1, second pixel units P2, and third pixel unit P3 of different colors.

The plurality of openings in the pixel define layer may include first opening, second openings, and third openings corresponding to the first pixel units P1, the second pixel units P2, and the third pixel units P3, respectively.

The plurality of pixel units may be arranged as an array along a first direction X and a second direction Y. The first direction X and the second direction Y may intersect with each other.

The first pixel units P1, the second pixel units P2, and the third pixel units P3 may be cyclically arranged in a fixed order along the first direction X. For example, as shown in FIG. 6, each pixel unit in each pixel unit row extending along the first direction X may be cyclically arranged in an order of P1, P3, and P2.

Two adjacent pixel units extending along the first direction X may be arranged with a certain offset. For example, as shown in FIG. 6, the second pixel units P2 extending along the first direction X may be retracted inward by a certain distance. Each pixel unit in the same pixel unit row extending along the second direction Y may have a same color. For example, in FIG. 6, each pixel unit in the first pixel unit row extending along the second direction Y may be the first pixel unit P1.

In particular, as shown in FIG. 6, in the display panel provided by the present disclosure, the pattern of the metal connection layer may include a plurality of strip-shaped structures L1 extending along the second direction Y. The strip-shaped structure L1 may include a plurality of half-surrounding structures K1 that are sequentially connected and that open at the same direction or same opening direction. In one embodiment, each half-surrounding structure K1 may surround substantially half of an opening.

Each opening surrounded by each half-surrounding structure K1 of the same strip-shaped structure L1 may correspond to a plurality of pixel units arranged continuously in a row of pixel units extending along the second direction Y. For example, each opening surrounded by each half-surrounding structure K1 of the leftmost strip-shaped structure L1 in FIG. 6 may correspond to a plurality of first pixel units P1 that are continuously arranged in a first pixel unit row extending in the second direction Y.

There are at least two pixel unit rows extending along the second direction Y between two adjacent strip-shaped structures L1. The photo spacers 108 may be disposed between two adjacent pixel unit rows between the two adjacent strip-shaped structures L1. In particular, along the first direction X, the strip-shaped structures L1 may be alternately arranged with a row of photo spacers 108 extending along the second direction Y.

In one embodiment, the pattern of the metal connection layer may be set to have a plurality of strip-shaped structures, and the opening direction of the plurality half-surrounding structures included in the strip-shaped structure may be same. Further, each half-surrounding structure may surround at last half of an opening, and each opening surrounded by each of the half-surrounding structures in the same strip-shaped structure may correspond to a plurality of pixel units continuously arranged in a row. Thus, the spaces around the openings may be more fully used to cause the area of the metal connection layer to be large. Further, the carriers that migrate laterally may tend to flow to the metal connection layer to avoid the light-leakage phenomenon.

Further, the strip-shaped structures may be alternately arranged with the row of photo spacers. Such a configuration may prevent the pattern of the metal connection layer from overlapping with the photo spacers. Accordingly, the effect to the connection effect between the metal connection layer and the second electrode caused by the covering of the photo spacers to the pattern of the metal connection layer may be prevented.

FIG. 7 illustrates another exemplary pattern of the metal layer of the display panel. As shown in FIG. 7, in the display panel provided by the present disclosure, the pattern of the metal connection layer may include a plurality of strip-shaped structures L2 extending along the first direction X. Each of the strip-shaped structures L2 may include a plurality of half-surrounding structures K2 that are sequentially connected and have a same opening direction. Each half-surrounding structure K2 may surround one opening.

The opening surrounded by each half-surrounding structure K2 of the same strip-shaped structure L2 may correspond to a plurality of consecutively arranged pixel units in a pixel unit row extending along the first direction X. For example, the openings surrounded by the semi-enclosing structures K2 of the uppermost stripe-shaped structure L2 in FIG. 7 may correspond to the continuously arranged second pixel unit P2, first pixel unit P1, third pixel unit P3, and second pixel unit P2 in the first pixel unit row extending along the first direction X There may be at least two pixel unit rows extending along the first direction X between two adjacent strip-shaped structures L2. The photo spacers 108 may be located between two adjacent pixel unit rows between the two adjacent strip-shaped structures L2. In particular, along the second direction Y, the strip-shaped structures L2 may be alternately arranged with a row of photo spacers 108 extending along the first direction X.

The pattern of the metal connection layer may be set to include the plurality of strip-shaped structures, and the opening direction of the plurality of half-surrounding structures included in the strip-shaped structure may be same. Each half-surrounding structure may surround one opening, and each opening surrounded by each half-surrounding structure in the same strip-shaped structure may correspond to a plurality of pixel units continuously arranged in a row. Thus, the spaces around the openings may be more fully used; and the area of the metal connection layer may be relatively large. Further, the carriers that migrate laterally may tend to flow to the metal connection layer; and the light-leaking phenomenon may be avoided.

Further, the strip-shaped structures may be alternately arranged with a row of photo spacers. Such a configuration may prevent the pattern of the metal connection layer from overlapping with the photo spacers. The adverse effect to the contact effect between the pattern of the metal connection layer and the second electrode caused by the issue that the photo spacers cover the pattern of the metal connection layer may be avoided.

In particular, the line width of the strip-shaped structure may be smaller than the distance between two adjacent openings. For example, the line width of the strip-shaped structure may be a range of greater than or equal to 10 μm and equal to or smaller than 25 μm.

In the practical implementations, the pattern of the metal connection layer may be set according to one or two of the previous described embodiments. In some embodiments, one or more regions of the metal connection layer may be set according to the previous described embodiments. The pattern of the metal connection layer may be set according to the spaces between the pixel units.

Figure 8:
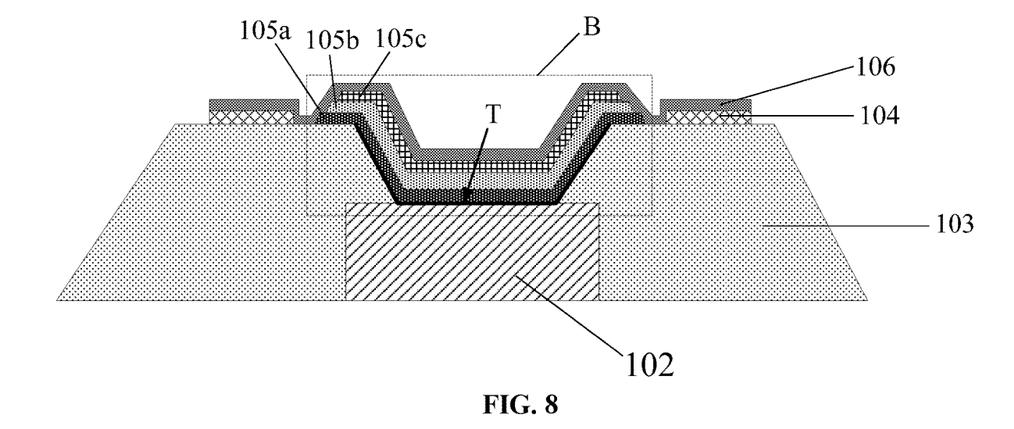
FIG. 8 illustrates a zoomed-in view of an opening in FIG. 1.

FIG. 8 is a zoomed-in view of an exemplary opening in FIG. 1. In one embodiment, as show in FIG. 1 and FIG. 8, in the display panel provided by the present disclosure, the organic light-emitting layer 105 may include a plurality of light-emitting units B corresponding to each opening T, respectively. The light-emitting unit B may cover the corresponding opening T and the surface of the pixel define layer 103 at the edge of the opening T.

Along a direction from the pixel define layer 103 to the substrate 101, a portion of the light-emitting unit of the pixel define layer 103 covering the pixel define layer 103 may gradually expand outward from an edge of a cross section parallel to the substrate 101 away from the opening T.

To prevent the organic light-emitting layer 105 from covering the pattern of the metal connection layer 104 and affecting the contact effect between the metal connection layer 104 and the second electrode 106, in one embodiment of the present disclosure, the organic light-emitting layer 105 may be configured to include the openings T in one-to-one corresponding to the light-emitting units B. Thus, the organic light-emitting layer 105 may be prevented from completely covering the surface of the metal connection layer 104 to ensure that the metal connection layer 104 may directly contact with the second electrode 106.

In one embodiment of the present disclosure, the metal connection layer 104 may be disposed on a side of the pixel define layer 103 facing away from the substrate 101 such that the distance between the metal connection layer 104 and the second electrode 106 may be substantially small. Accordingly, it may prevent the second electrode 106 from being broken caused by the height difference of the metal connection layer 104.

To further ensure the continuity of the second electrode 106 and prevent the second electrode 106 from being broken due to the height difference of the film layers below the second electrode 106, in one embodiment of the present disclosure, the light-emitting unit B may be disposed with a following manner.

Along the direction from the pixel define layer 103 to the substrate 101, a portion of the light-emitting unit of the pixel define layer 103 covering the pixel define layer 103 may gradually expand outward from an edge of a cross section parallel to the substrate 101 away from the opening T. The configuration that the light-emitting unit B includes three-layer organic layers: 105a, 105b 105c is used taken as an example. As shown in FIG. 8, the edges of the organic layer 105a, the organic layer 105b, and the organic layer 105c gradually expand outward such that the edge of the light-emitting unit B may be sloped. When the second electrode 106 is formed, the second electrode 106 may extend along the edge of the light-emitting unit B to prevent the second electrode 106 from being broken due to a large height difference in the layer bellow the second electrode 106.

In the practical applications, the organic light-emitting layer 105 may include organic layers such as a hole injection layer, a hole transport layer, an organic light-emitting material layer, an electron transport layer, and/or an electron injection layer, etc.

Further, based on similar principles, the edges of the pattern of the metal connection layer 104 between the pixel define layer 103 and the second electrode 106 may also be formed to be sloped, and the edges of the photo spacers 108 may also be disposed to be sloped to ensure the continuity of the second electrode 106.

Further, in the display panel provided the present disclosure, as shown in FIG. 1 and FIG. 8, the orthographic projection of the light-emitting unit B on the substrate 101 and the orthographic projection of the pattern of the metal connection layer 104 on the substrate 101 may not overlap with each other. Such a configuration may ensure that the metal connection layer 104 may be directly and electrically connected with the second electrode 106. Accordingly, the adverse effect of the light-emitting unit to the conductive performance between the metal connection layer 104 and the second electrode 106 may be avoided.

In one embodiment, referring to FIG. 1 and FIG. 8, in the display panel provided by the present disclosure, a microcavity structure may be formed between the first electrode 102 and the second electrode 106, and the number of the resonance mode of the organic light-emitting layer 105 may be changed to be less than 2 such that the thickness of the organic light-emitting material layer of the organic light-emitting layer 105 may be substantially thin. Accordingly, the height difference at the edges of adjacent organic layers may be reduced. Thus, the issue that the second electrode 106 may be broken due to the large height difference of the film layers under the second electrode 106 may be reduced.

Furthermore, in the display panel provided by the present disclosure, the second electrode may include gold particles, aluminum particles, or copper particles, etc. The second electrode may be made of silver (Ag) or silver magnesium (MgAg) alloy, etc. Because gold particles, aluminum particles, or copper particles may have good ductility and conductivity, incorporating the gold particles, the aluminum particles or the copper particles may further improve the ductility of the second electrode on the basis of ensuring the second electrode to have a good conductivity, and ensure that the second electrode is not easy to be broken.

Further, in practical applications, some of the light-emitting layers 105 may be used as organic film layers of the common film layer or may be provided as an entire layer. Thus, during the evaporation processes, a common metal mask (CMM) may be used to form the common film layers, such as an organic film layer including a hole injection layer, a hole transport layer, an electron transport layer, and an electron injection layer. Accordingly, the production cost may be reduced.

The present disclosure also provides a method for forming a display panel. The principle of solving problems by the fabrication method is similar to the display panel, the implementation of the fabrication method may be referred to the previous description of the display panel.

Figure 9:
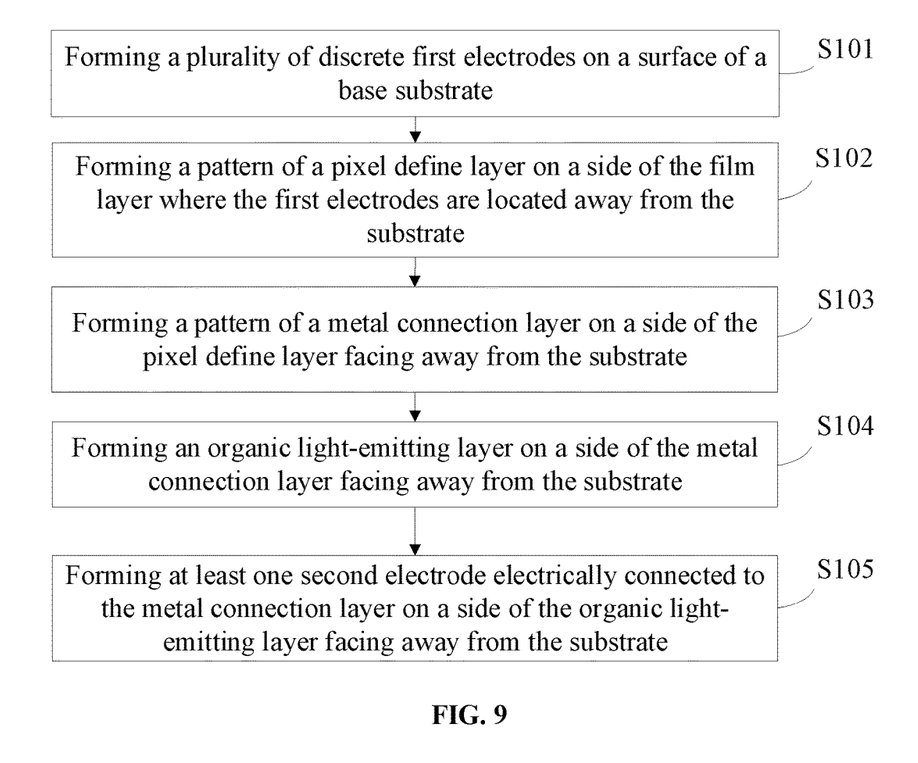
FIG. 9 illustrates an exemplary flow chart for forming a display panel consistent with various disclosed embodiments of the present disclosure.

FIG. 9 illustrates a flow chart of an exemplary fabrication method of a display panel consistent with various disclosed embodiments of the present disclosure.

As shown in FIG. 9, the method for forming a display panel provided by the present disclosure may include:

S201: forming a plurality of discrete first electrodes on a surface of a base substrate;

S202: forming a pattern of a pixel define layer on a side of the film layer where the first electrodes are located away from the substrate;

S203: forming a pattern of a metal connection layer on a side of the pixel define layer facing away from the substrate;

S204: forming an organic light-emitting layer on a side of the metal connection layer facing away from the substrate; and S205: forming at least one second electrode electrically connected to the metal connection layer on a side of the organic light-emitting layer facing away from the substrate.

According to the method for forming the display panel provided by the present disclosure, by forming a pattern of a metal connection layer on the side of the pixel define layer facing away from the base substrate, a subsequently formed second electrode may be directly and electrically connected to the metal connection layer. Thus, the in-plane resistance of the second electrode may be reduced, and the voltage drop in the display area may be reduced. Accordingly, the voltage distribution in the display panel may be more uniform, and the difference between the voltage in the display area and the voltage on the fixed voltage signal line on the peripheric region may be substantially small. Thus, the display uniformity of the display panel may be improved. Further, the thickness of the second electrode may be substantially thin, and the second electrode may be ensured to have a relatively high light transmittance.

Forming the connection metal layer on the side of the pixel define layer facing away from the base substrate may allow the distance between the metal connection layer and the second electrode to be substantially small. Thus, the direct contact between the second electrode and the metal connection layer may be facilitated; and the breaking of the second electrode caused by the height difference of the layers under the second electrode may be avoided. Further, the pattern of the metal connection layer may be formed by an etching process. Before the evaporation process, the pattern of the metal connection layer may be formed by an array substrate process, the multiple switching between the array substrate process and the evaporation process of the manufacturing process of the display panel may be avoided. Thus, the process for forming the display panel may be easy to achieve and the complexity of the manufacturing process may be reduced.

In particular, the exemplary step S204 in the fabrication method provided by the present disclosure may include forming each film layer of the organic light-emitting 1 layer by an evaporation process using a high-precision metal mask (fine metal mask, FMM) to cover the area except the openings.

In one embodiment of the present disclosure, the FMM may be used to cover the areas other than the openings such that the organic light-emitting layer including a plurality of light-emitting units may not be covered. Thus, the completely coverage of the organic light-emitting layer on the metal connection layer may be avoided; and the effect of the coverage to the contact effect between the metal connection layer and the second electrode may be avoided. The FMM may completely shield the pattern of the metal connection layer during the evaporation process for forming the organic light-emitting layer. Thus, the direct contact between the metal connection layer and the second electrode may be ensured.

In the practical applications, the exemplary step S202 in the fabrication method provided by the present disclosure may include forming the patterns of the pixel define layer and the photo spacers on a side of the film layer where the first electrodes are located facing away from the substrate by a same patterning process using a half-tone mask.

By using the halftone mask, the transmittance at positions of the photo spacers may be different from the transmittance at other locations corresponding to the top layer of the pixels. The pattern of the pixel define layer and the photo spacers may be formed by the same patterning process. Thus, one mask may be saved, and one fabrication step may be reduced. Accordingly, the production cost may be reduced.

Further, the present disclosure provides a display apparatus. The display apparatus may include the disclosed apparatus, or other appropriate apparatus. The display apparatus may be any products or components having a display function, such as a mobile phone, etc.

Figure 10:
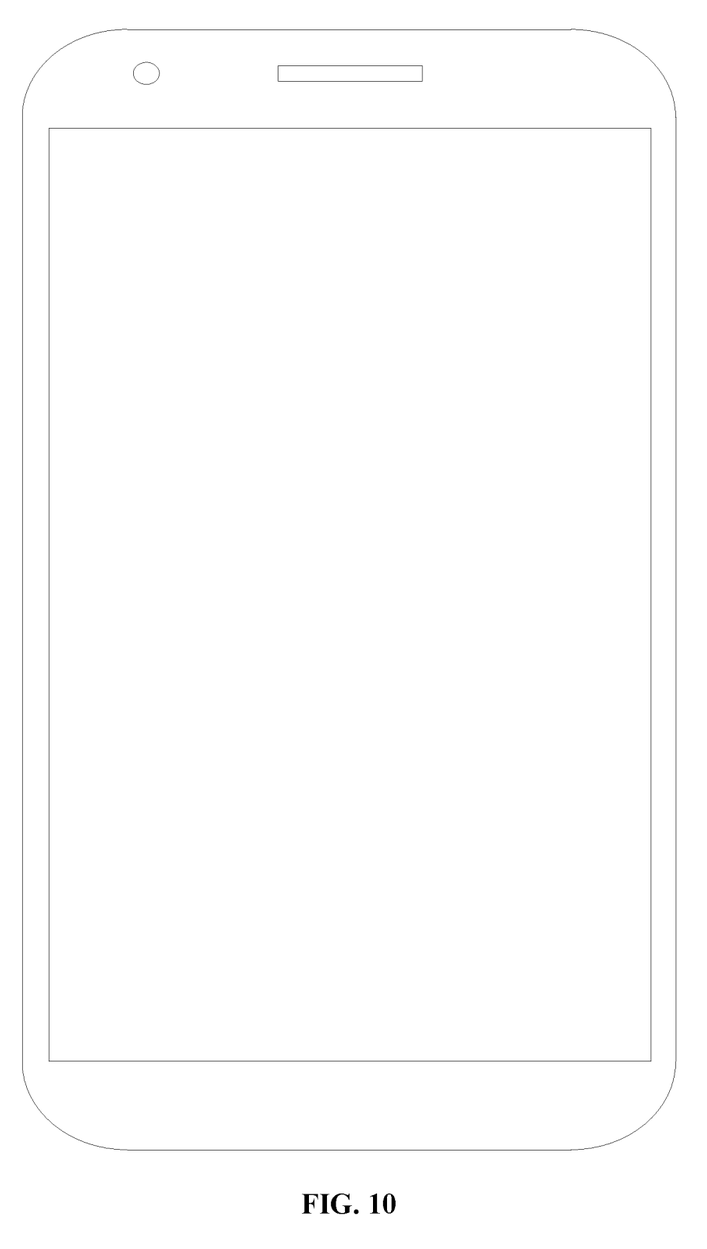
FIG. 10 illustrates an exemplary display apparatus consistent with various disclosed embodiments of the present disclosure.

FIG. 10 illustrates an exemplary display apparatus consistent with various disclosed embodiments of the present disclosure.

As shown in FIG. 10, the display apparatus may be a mobile phone. The display panel of the mobile phone may be the display panel provided by the present disclosure. Further, the display apparatus may be other products or devices, such as a tablet computer, a television, a display screen, a notebook computer, a digital photo frame, or a navigator, etc. Because the principle of the display apparatus for solving the problems may be similar to that of the previous described display panel, the implementation of the display apparatus may be referred to the implementation of the previous disclosed display panel.

In the present disclosed display panel, fabrication method thereof and display apparatus, the metal connection layer may be disposed on a side of the pixel define layer facing away from the substrate, and the metal connection layer may be electrically connected to the second electrode. The second electrode may be connected with the metal connection layer in parallel. Thus, the in-plane resistance of the second electrodes may be reduced; and the voltage drop in the display area may be reduced. Accordingly, the voltage distribution in the display area may be more uniform; and the difference between the voltage in the display area and the voltage on the fixed voltage signal line on the peripheric region may be relatively small. Thus, the display uniformity of the display panel may be improved.

Because the in-plane resistance of the second electrode may be reduced by connecting with the metal connection layer, the second electrode may be formed with a relatively small thickness to ensure that the second electrode to have a high light transmittance. Further, the orthographic projection of the pattern of the metal connection layer on the substrate may at least partially surround the opening. Such a configuration may make a full use of the spaces in the non-opening areas. Thus, the area of the pattern of the metal connection layer may be relatively large; and the resistance of the metal connection layer may be further reduced. Accordingly, the resistance after connecting the metal layer with the second electrode in parallel may be further reduced, and the display uniformity of the display panel may be further improved.

Although exemplary embodiments of the present disclosure have been described, those skilled in the art can make other changes and modifications to these embodiments once they know the basic inventive concepts. Therefore, the appended claims are intended to be construed to include the exemplary embodiments and all changes and modifications that fall within the scope of the invention.

Obviously, those skilled in the art can make various modifications and variations to the present disclosure without departing from the spirit and scope of the present disclosure. In this way, if these modifications and variations of the present disclosure fall within the scope of the claims of the present disclosure and their equivalent technologies, the present disclosure also intends to include these modifications and variations.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:
1. A display panel, comprising:
   a substrate;
   a plurality of first electrodes, disposed on one side of the substrate and discrete from each other;

a pixel define layer, disposed on a same side of the substrate with the plurality of first electrodes and including a plurality of openings exposing each of the plurality of first electrodes, respectively;

a metal connection layer, disposed on a side of the pixel define layer facing away from the substrate, wherein an orthographic projection of a pattern of the metal connection layer on the substrate at least surrounds half of at least one opening of the plurality of openings, the metal connection layer includes a plurality of elongated-shape structures, and each of the plurality of elongated-shape structures is isolated from an adjacent elongated-shape structure within a display area of the display panel;

a plurality of photo spacers disposed on the side of the pixel define layer facing away from the substrate, wherein the plurality of photo spacers are arranged in a second direction, and in a plan view, the plurality of elongated-shape structures and columns of a portion of the plurality of the photo spacers are arranged alternatively in a first direction intersecting with the second direction;

an organic light-emitting layer, disposed on the side of the pixel define layer facing away from the substrate;

a plurality of pixel units arranged as an array along the first direction, and the second direction in the plurality of openings, each of the plurality of pixel units having diagonals and sides, wherein:

a pixel unit of the plurality of pixel units and an adjacent pixel unit from an adjacent row are separated by a photo spacer or the adjacent elongated-shape structure; and at least one second electrode, disposed on a side of the organic light-emitting layer and the side of the pixel define layer facing away from the substrate, wherein:

each of the plurality of elongated-shape structures includes a plurality of ring structures, each of the plurality of ring structures surrounds at least two of pixel units of the plurality of pixel units, and the at least two of pixel units are separated by a corresponding photo spacer of a remaining portion of the plurality of photo spacers, an orthographic projection of the metal connection layer on the substrate has no overlapping with an orthographic projection of the plurality of photo spacers, and an orthographic projection of the at least one second electrode on the substrate covers an orthographic projection of the pixel define layer and the plurality of first electrodes on the substrate, and the at least one second electrode is electrically connected to the metal connection layer.

2. The display panel according to claim 1, wherein:
an orthographic projection of the pattern of the metal connection layer on the substrate is within the orthographic projection of the pixel define layer on the substrate.

3. The display panel according to claim 2, wherein:
an orthographic projection of the plurality of photo spacers on the substrate is within the orthographic projection of the pixel define layer on the substrate; and
the orthographic projection of the plurality of photo spacers on the substrate does not overlap with the orthographic projection of the metal connection layer on the substrate.

4. The display panel according to claim 3, wherein each of the plurality of ring structures at least surrounding one of the plurality of openings.

5. The display panel according to claim 4, wherein:
the display panel includes a plurality of pixel units;
the plurality of pixel units include a plurality of repeating units arranged along a first direction and a second direction intersecting with the first direction;
each of the plurality of repeating units includes a first pixel unit, a second pixel unit and a third pixel unit of different colors;
the plurality of openings in the pixel define layer include first openings, second openings and third openings corresponding to the first pixel units, the second pixel units and the third pixel units, respectively;
the first pixel and the second pixel in each of the plurality of repeating units form a pixel unit group and are arranged along the second direction; and
the third pixel unit is located at one side of the pixel unit group along the first direction.

6. The display panel according to claim 5, wherein:
the ring structure surrounds the first opening and the second opening corresponding to the pixel unit group;
each of the ring structures along the second direction is connected to each other;
the photo spacers are disposed between the first openings and the second openings corresponding to the pixel unit group; and/or
the photo spacers are disposed between adjacent third openings along the second direction.

7. The display panel according to claim 1, comprising:
the display area; and
a non-display area surrounding the display area,
wherein:
the non-display area includes a conductive structure disposed on a same layer with the plurality of first electrodes, and a fixed voltage signal line disposed between a layer where the plurality of first electrodes are disposed and the substrate;
an orthographic projection of the conductive structure on the substrate and an orthographic projection of the at least one second electrode on the substrate has an overlapped area;
the at least one second electrode and the conductive structure are connected in the overlapped area;
the fixed voltage signal line surrounds the display area; and
the conductive structure is electrically connected to the fixed voltage signal line.

8. The display panel according to claim 1, wherein the organic light-emitting layer comprises:
a plurality of light-emitting units corresponding to each of the plurality of openings, respectively,
wherein:
the light-emitting units cover the corresponding opening and portions of a surface of the pixel define layer at edges of the openings; and
along a direction from the pixel define layer to the substrate, light-emitting units in the plurality of light-emitting units covering the portions of the pixel define layer gradually extends outwardly from the edges of the openings on a cross-section parallel to the substrate.

9. The display panel according to claim 8, wherein:
an orthographic projection of the light-emitting units on the substrate does not overlap with an orthographic projection of the pattern of the metal connection layer on the substrate.

10. A method for fabricating a display panel, comprising:
forming a plurality of discrete first electrodes on a surface of a substrate;
forming a pattern of a pixel define layer on a side of a film layer where the plurality of first electrodes are located facing away from the substrate, and the pixel define layer includes a plurality of openings exposing each of the plurality of discrete first electrodes, respectively;
forming a pattern of a metal connection layer on a side of the pixel define layer facing away from the substrate, wherein the metal connection layer includes a plurality of elongated-shape structures, and each of the plurality of elongated-shape structures is isolated from an adjacent elongated-shape structure within a display area of the display panel;
forming a plurality of photo spacers on the side of the pixel define layer facing away from the substrate, wherein the plurality of photo spacers are arranged in a second direction, and in a plan view, the plurality of elongated-shape structures and columns of a portion of the plurality of the photo spacers are arranged alternatively in a first direction intersecting with the second direction;
forming a plurality of pixel units arranged as an array along the first direction, and the second direction in the plurality of openings, each of the plurality of pixel units having diagonals and sides, wherein:
  each of the plurality of elongated-shape structures includes a plurality of ring structures, each of the plurality of ring structures surrounds at least two of pixel units of the plurality of pixel units, and the at least two of pixel units are separated by a corresponding photo spacer of a remaining portion of the plurality of photo spacers,
  an orthographic projection of the metal connection layer on the substrate has no overlapping with an orthographic projection of the plurality of photo spacers, and
  a pixel unit of the plurality of pixel units and an adjacent pixel unit from an adjacent row are separated by a photo spacer or the adjacent elongated-shape structure;
forming an organic light-emitting layer on a side of the metal connection layer facing away from the substrate; and
forming at least one second electrode electrically connected to the metal connection layer on a side of the organic light-emitting layer facing away from the substrate.

11. The method according to claim 10, wherein forming the organic light-emitting layer on the side of the metal connection layer facing away from the substrate comprises:
forming each layer of the organic light-emitting layer by an evaporation process using a fine metal mask (FMM) to cover areas except each opening.

12. The display panel according to claim 10, wherein forming the pattern of the pixel define layer on the side of the film layer where the plurality of first electrodes are disposed facing away from the substrate comprises:
forming a plurality of photo spacers and the pattern of the pixel define layer on a side of the film layer where the plurality of first electrodes are disposed facing away from the substrate by a same patterning process using a half-tone mask.

13. A display panel, comprising:
a substrate;
a plurality of first electrodes, disposed on one side of the substrate and discrete from each other;
a pixel define layer, disposed on a same side of the substrate with the plurality of first electrodes and including a plurality of openings exposing each of the plurality of first electrodes, respectively;
a metal connection layer, disposed on a side of the pixel define layer facing away from the substrate, wherein an orthographic projection of a pattern of the metal connection layer on the substrate at least surrounds half of at least one opening of the plurality of openings, the metal connection layer includes a plurality of elongated-shape structures, and each of the plurality of elongated-shape structures is isolated from an adjacent elongated-shape structure within a display area of the display panel;
a plurality of photo spacers disposed on the side of the pixel define layer facing away from the substrate, wherein the plurality of photo spacers are arranged in a second direction, and in a plan view, the plurality of elongated-shape structures and columns of the photo spacers are arranged alternatively in a first direction intersecting with the second direction;
an organic light-emitting layer, disposed on the side of the pixel define layer facing away from the substrate;
a plurality of pixel units arranged as an array along the first direction, and the second direction in the plurality of openings, each of the plurality of pixel units having diagonals and sides, wherein:
  each pixel unit in a same row of the array has at least one diagonal aligned with each other in the first direction, adjacent rows of array are arranged in a staggered arrangement, and sides of pixel units of adjacent rows are arranged parallel to each other, and
  a pixel unit of the plurality of pixel units and an adjacent pixel unit from an adjacent row are separated by a photo spacer or the adjacent elongated-shape structure; and
at least one second electrode, disposed on a side of the organic light-emitting layer and the side of the pixel define layer facing away from the substrate,
wherein:
when no portion of the plurality of strip-shaped structures is located between two adjacent openings, a photo spacer of the plurality of photo spacers is located between the two adjacent openings,
an orthographic projection of the metal connection layer on the substrate has no overlapping with an orthographic projection of the plurality of photo spacers, and
an orthographic projection of the at least one second electrode on the substrate covers an orthographic projection of the pixel define layer and the plurality of first electrodes on the substrate, and the at least one second electrode is electrically connected to the metal connection layer.

* * * * *